United States Patent [19]

Lee et al.

[11] Patent Number: 5,420,076

[45] Date of Patent: May 30, 1995

[54] METHOD OF FORMING A CONTACT FOR MULTI-LEVEL INTERCONNECTS IN AN INTEGRATED CIRCUIT

[75] Inventors: Charles K. Lee, Richardson; Shin-Puu Jen, Plano, both of Tex.

[73] Assignee: Texas Instruments Incorporated, Dallas, Tex.

[21] Appl. No.: 176,617

[22] Filed: Jan. 3, 1994

[51] Int. Cl.⁶ .......................... H01L 21/44
[52] U.S. Cl. ............................... 437/195
[58] Field of Search .................. 156/643; 437/195

[56] References Cited

U.S. PATENT DOCUMENTS

| | | | |
|---|---|---|---|
| 4,495,220 | 1/1985 | Wolf et al. | 156/643 |
| 4,990,467 | 2/1991 | Lee et al. | 437/192 |
| 5,228,950 | 7/1993 | Webb et al. | 156/643 |

OTHER PUBLICATIONS

Wolf & Tauber "Silicon Processing for the VLSI Era" vol I Lattice Press 1986 pp. 574-583.

Wolf & Tauber "Silicon Processing for the VLSI Era" vol II Lattice Press 1990 pp. 193, 250, 284.

*Primary Examiner*—Brian E. Hearn
*Assistant Examiner*—Trung Dang
*Attorney, Agent, or Firm*—John D. Crane; Richard Donaldson

[57] ABSTRACT

A via opening (24) is formed within a semiconductor structure (10) in order to allow for the insertion of a contact to establish multi-level interconnects in an integrated circuit. The via opening (24) extends to a conductive layer (16) within the semiconductor structure (10). During the formation of the via opening (24), a residual layer (26) is created within the via opening (24) and on the exposed surface of the conductive layer (16). A dry plasma material is introduced at the semiconductor structure (10) to remove the residual layer (26) from the via opening (24) and the exposed surface of the conductive layer (16). After removal of the residual layer (26), a conductive material for establishing the contact for connection to the conductive layer (16) is inserted within the via opening (24).

7 Claims, 1 Drawing Sheet

METHOD OF FORMING A CONTACT FOR MULTI-LEVEL INTERCONNECTS IN AN INTEGRATED CIRCUIT

TECHNICAL FIELD OF THE INVENTION

The present invention relates in general to semiconductor fabrication processes and more particularly to a method of forming a via for multi-level interconnects in an integrated circuit.

BACKGROUND OF THE INVENTION

For integrated circuit fabrication, a semiconductor structure is formed with multiple layers of conductive material to allow for a multi-level interconnecting between devices formed on the semiconductor structure. A connection to one of these conductive layers is achieved by etching a via opening through the dielectric structure and to the desired conductive layer. Conventional etching processes use carbon fluoride based gases, such as $CF_4$ or $CHF_3$, to etch the via opening into the semiconductor structure in order to form a metal contact in the via opening at the desired conductive layer. However, the etching process leaves a residual layer on the exposed conductive layer of the semiconductor structure that adds a resistance within the via opening.

The conventional approach to remove the residual layer from the conductive layer within the via opening is to introduce wet chemicals at the semiconductor structure in order to clean off the residual layer. This wet chemical process is costly and inserts toxic materials that raise environmental concerns. Further, the wet chemical process is not effective for small device fabrication due to the decreasing size of the via opening. Therefore, it is desirable to have a cleanup process that is less expensive, environmentally desirable, and suitable for small device fabrication.

SUMMARY OF THE INVENTION

From the foregoing, there is a need for a process that removes an undesirable residual layer created during formation of via openings for multi-level interconnects. A need has also arisen for a multi-level interconnect process that is environmentally safe and suitable for small device fabrication.

In accordance with the present invention, a method of forming a via for multi-level interconnects in an integrated circuit is provided which eliminates the disadvantages associated with conventional multi-level interconnect techniques.

According to an embodiment of the present invention, there is provided a method of forming a via for multi-level interconnects in an integrated circuit that includes etching a semiconductor structure to form a via opening in order to expose a conductive layer within the semiconductor structure. As a result of the via etching, a residual insulating material forms on the conductive layer. A dry plasma material is introduced at the semiconductor structure to remove the residual layer from the conductive layer. Once the residual layer is removed, a conductive material can be formed in the via opening to establish a metal contact in connection with the conductive layer.

The method of the present invention provides various technical advantages over conventional multi-level interconnect techniques. For example, one technical advantage is in removing the residual layer from the conductive layer in order to avoid unnecessary increases of resistance within the via opening. Another technical advantage is in using a dry chemical process to remove the residual layer and avoid the costs, cycle time, and environmental hazards associated with a wet chemical removal of the residual layer. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1A:
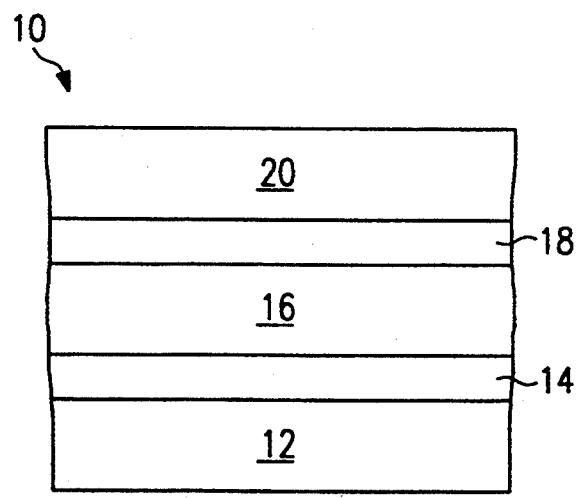
FIGS. 1A-C illustrate an etching process for creating a via opening within a semiconductor structure.
Figure 1B:
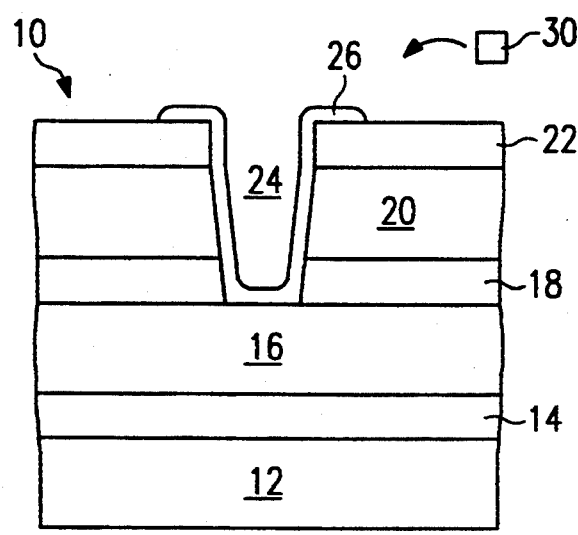
Figure 1C:
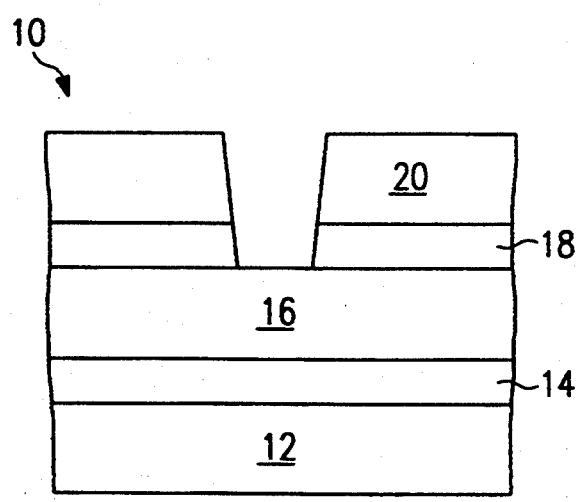

FIGS. 1A-C show a process for fabricating a contact to a conductive layer within a semiconductor structure. FIG. 1A shows the initial semiconductor structure 10 having an oxide layer 12 and a barrier layer 14 formed on oxide layer 12. A conductive layer 16 is formed on barrier layer 14 and separates barrier layer 14 from a cap layer 18. A second oxide layer 20 is formed on cap layer 18. Oxide layer 12 is conventionally made of silicon dioxide and second oxide layer 20 typically is made of plasma enhanced tetroethylsilicate. Cap layer 18 and barrier layer 14 are typically made of a metal material such as titanium nitride and conductive layer 16 is typically made of a metal material such as an aluminum-silicon-copper alloy.

FIG. 1B shows the etching process on semiconductor structure 10. A photoresist layer 22 is formed on second oxide layer 20 to selectively identify a space for a via opening 24. Semiconductor structure 10 is etched through second oxide layer 20 through cap layer 18 and into conductive layer 16 to form via opening 24. Depending upon the layer desired for the contact interconnect, via opening 24 may extend to cap layer 18 or conductive layer 16. As a result of the etching process, an interaction occurs between the etching material used in semiconductor structure 10. This interaction causes a residual layer 26 to form on an exposed surface of conductive layer 16. Residual layer 26 causes a high resistance within via opening 24 in a resulting end device.

Carbon fluoride based gases, such as $CF_4$ or $CHF_3$, are often used for the etch process to form via opening 24 for establishing a contact with conductive layer 16 that achieves the multi-level interconnections. If conductive layer 16 is made of aluminum, the carbon fluoride plasma interacts with the aluminum to produce a residual layer 26 comprised of a mixture of aluminum fluoride compounds $AlF_3$ and $AlF_2$ or aluminum oxide compounds $Al_2O_3$. Residual layer 26 is of an inorganic nature and thus cannot be removed by oxygen plasma, or ashing, processes. An ashing process applied to residual layer 26 may even thicken residual layer 26 due to the further oxidation of conductive layer 16.

To remove residual layer 26, a dry plasma chemistry 30 can be applied to semiconductor structure 10. Dry plasma material 30 preferably comprises boron tri-chloride and chlorine $BCl_3/Cl_2$ that interacts with residual layer 26 to form aluminum chloride $AlCl_3$ for an aluminum metal layer or titanium chloride $TiCl_4$ for a titanium nitride metal layer which are volatile and can be evacuated away from via opening 24. A preferred operating condition has a BCl$_3$ flow rate of 30–100 SCCM and a Cl$_2$ flow rate no greater than 5 SCCM, at a power of 50–150 Watts.

FIG. 1C shows a semiconductor structure 10 after introduction of dry plasma material 30 and evacuation of residual layer 26. Conductive layer 16 can etch away due to the introduction of the dry plasma material. The selectivity between residual layer 26 and the underlying conductive layer 16 can be achieved by changing the flow ratio and flow rate of dry plasma material 30. The etch rate of conductive layer 16 decreases as the dry plasma material 30 ratio increases. Second oxide layer 20 is not effected by the introduction of the dry plasma material. Appendix A is a set of electron microscope photographs taken after etching of via opening 24 and showing residual layer 26. Appendix B is a set of electron microscope photographs taken after introduction of the dry plasma material showing the removal of residual layer 26.

In summary, a dry plasma material can be introduced to eliminate a residual layer created during etching of a via opening for contact insertion to obtain multi-level interconnections. The dry plasma material effectively eliminates the residual layer without any adverse effect to remaining layers within the semiconductor structure.

Thus, it is apparent that there has been provided, in accordance with the present invention, a method of forming a via for multi-level interconnects in an integrated circuit that satisfies the advantages set forth above. Although the preferred embodiment has been described in detail, it should be understood that various changes, substitutions, and alterations can be made herein. For example, different materials and different formations steps may be employed other than those specifically described in conjunction with the figures. Other examples are readily ascertainable by one skilled in the art and could be made without departing from the spirit and scope of the present invention as defined by the following claims.

What is claimed is:

1. A method of forming a via for multilevel interconnects in an integrated circuit, comprising the steps of:

etching a semiconductor structure to form a via opening in order to expose a conductive layer within the semiconductor structure, said etching step causing a residual layer of material to form by chemical reaction between the etchant and the semiconductor structure on the conductive layer, on walls of the via opening, and on a surface of the semiconductor structure;

introducing a dry plasma material comprising boron trichloride and chlorine at the semiconductor structure for the time necessary to remove only the residual layer from the conductive layer, from the walls of the via opening, and from the surface of the semiconductor structure; and depositing a conductive material on the semiconductor structure and in the via opening to establish a metal contact in connection with the conductive layer.

2. The method of claim 1, further comprising the step of:

varying a flow rate of the dry plasma material to minimize etching of the conductive layer during removal of the residual layer.

3. The method of claim 1, further comprising the step of:

varying a ratio of the dry plasma material to minimize etching of the conductive layer during removal of the residual layer.

4. The method of claim 1, wherein the conductive layer is made of aluminum.

5. The method of claim 1, wherein the conductive layer is made of titanium nitride.

6. A method of providing multi level interconnects in an integrated circuit, comprising the steps of:

forming a plurality of conductive layers ia a semiconductor structure;

introducing an etch gas to form a via opening in the semiconductor structure to a selected one of the conductive layers, the etch gas interacting with the plurality of selective conductive layer to form a residual layer by chemical reaction between said etch gas and the semiconductor structure on the selected conductive layer, on walls of the via opening, and on the semiconductor structure;

introducing a dry plasma material consisting of a boron tri-chloride and chlorine at the semiconductor structure to remove the residual layer from the conductive layer, the walls of the via opening, and the semiconductor structure without a material adverse effect on the semiconductor structure; and forming a conductive material in the via opening and to establish a contact with the conductive layer on the semiconductor structure.

7. The method of claim 6, further comprising the step of:

varying a flow rate, flow ratio, power, and pressure of the dry plasma material to minimize etching of the conductive layer during removal of the residual layer.

* * * * *

UNITED STATES PATENT AND TRADEMARK OFFICE
CERTIFICATE OF CORRECTION

PATENT NO. : 5,420,076
DATED : May 30, 1995
INVENTOR(S) : Charles K. Lee, Shin-Puu Jeng It is certified that error appears in the above-indentified patent and that said Letters Patent is hereby corrected as shown below:

On cover page, item [75], listed inventors should read:

Charles K. Lee, Richardson;
Shin-Puu Jeng, Plano, both of Tex.

Signed and Sealed this

Fifteenth Day of April, 1997

Attest:

BRUCE LEHMAN

*Attesting Officer*     *Commissioner of Patents and Trademarks*